(12) United States Patent
Dong et al.

(10) Patent No.: US 8,138,051 B2
(45) Date of Patent: Mar. 20, 2012

(54) INTEGRATED CIRCUIT SYSTEM WITH HIGH VOLTAGE TRANSISTOR AND METHOD OF MANUFACTURE THEREOF

(75) Inventors: Yemin Dong, Singapore (SG); Purakh Raj Verma, Singapore (SG); Xin Zou, Singapore (SG); Chao Cheng, Singapore (SG); Shao-fu Sanford Chu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 246 days.

(21) Appl. No.: 12/488,451

(22) Filed: Jun. 19, 2009

(65) Prior Publication Data

US 2010/0320529 A1    Dec. 23, 2010

(51) Int. Cl.
*H01L 21/336* (2006.01)
*H01L 29/94* (2006.01)
*H01L 29/76* (2006.01)
*H01L 31/119* (2006.01)
*H01L 29/78* (2006.01)

(52) U.S. Cl. ............... 438/294; 257/327; 257/E21.409; 257/E29.255

(58) Field of Classification Search .................. 438/294; 257/327, E21.409, E29.255
See application file for complete search history.

(56) References Cited

U.S. PATENT DOCUMENTS

| | | | |
|---|---|---|---|
| 5,320,974 A * | 6/1994 | Hori et al. ...................... 438/302 |
| 5,643,822 A | 7/1997 | Furukawa et al. |
| 6,054,355 A * | 4/2000 | Inumiya et al. ............... 438/296 |
| 6,498,085 B2 | 12/2002 | Jung et al. |
| 7,037,803 B2 | 5/2006 | Inoue et al. |
| 7,205,586 B2 * | 4/2007 | Takagi et al. .................. 257/192 |
| 7,473,615 B2 | 1/2009 | Smith et al. |
| 2009/0130818 A1 | 5/2009 | Lin |
| 2009/0294848 A1* | 12/2009 | Chang .......................... 257/335 |

* cited by examiner

*Primary Examiner* — Luan C Thai
(74) *Attorney, Agent, or Firm* — Mikio Ishimaru

(57) ABSTRACT

A method of manufacture of an integrated circuit system includes: providing a semiconductor substrate having an active region, implanted with impurities of a first type at a first concentration; forming an isolation region around the active region; forming a parasitic transistor by applying a gate electrode, implanted with impurities of a second type at a second concentration, over the active region and the isolation region; and applying an isolation edge implant, with the impurities of the first type at a third concentration greater than or equal to the second concentration, for suppressing the parasitic transistor.

20 Claims, 6 Drawing Sheets

INTEGRATED CIRCUIT SYSTEM WITH HIGH VOLTAGE TRANSISTOR AND METHOD OF MANUFACTURE THEREOF

TECHNICAL FIELD

The present invention relates generally to an integrated system, and more particularly to a system for fabricating high voltage transistors with leakage current suppression.

BACKGROUND ART

A literal explosion of personal electronic devices has fostered frenzy of integrated circuit development and technology development. The demand for digital cameras in our cellular telephones has now expanded to include adding digital video recorders, global positioning systems, personal video players, and high quality audio. The integration of these functions makes power management and isolation a requirement for proper circuit operation.

Trenched isolation regions are commonly utilized for electrically isolating section adjacent structures in highly integrated semiconductor constructions. A common form of trenched isolation region is a so-called shallow trench isolation (STI) region.

STI isolation is an indispensable technique for deep sub-micron and nanometer CMOS circuit designs. However, it is known that an STI isolated transistor inherently has two parasitic STI edge transistors that may be formed where the gate oxide extends over the edge of the trench isolation regions on either side of the intended transistor.

A difficulty which can occur when utilizing the trenched isolation region adjacent to a transistor structure is that any sharp active corner at the trenched isolation region edge can lead to a high fringing electric field, which can establish a parasitic transistor with a lower threshold voltage (Vth) along the trench edge in parallel to the intended transistor.

An edge parasitic transistor with a lower Vth provides a leakage path even before the intended transistor is turned "on." This can lead to numerous problems during operation of the intended transistor, and can manifest as a "double hump" in the sub-threshold characteristics of the intended transistor. The uncontrolled parasitic transistor may send an uncontrolled amount of current to an incorrect destination. Such unintended current paths may destroy the unintended destination device due to the excessive current from the parasitic transistor.

The double hump issue is a sign that unintended parasitic transistors are conducting current. In some cases they can cause intermittent errors because as the intended transistor is activated, the parasitic transistors may reinforce or resist the intended current flow. The low ebb of the double hump may cause erroneous power resets to be generated or detected. The double hump issue can be worse for high-voltage devices due to lower well concentration and higher operating voltage. Early field failures due to the operation of the parasitic transistors can cost original equipment manufacturers millions of dollars to repair.

Another problem that can occur with field oxide is thinning of the field oxide at corners under transistor gates. The thinning can occur due to thermal oxide tending to not grow as thick on the corners as in the central region of the field oxide. The thinning of the field oxide at the corners can exacerbate the fringing electric field problems discussed above, and can lead to decreased reliability of the oxide.

An example of such problems may be a high voltage NMOS transistor having a sub-threshold curve that has no obvious hump at zero body bias. With the increase of body bias, the double hump may appear and become increasingly worse. For an advanced low voltage transistor, the double hump may appear even at zero body bias and a great amount of effort has gone into optimizing the corner rounding process for trench isolation regions.

Numerous approaches have been developed for attempting to alleviate problems associated with sharp active corners at trenched isolation region edges, but such approaches have not yet proven to be fully satisfactory. Accordingly, it would be desirable to develop new methodologies for alleviating problems associated with sharp active corners at trenched isolation region edges.

Thus, a need still remains for an integrated circuit system with high voltage transistor that can relieve the leakage current problems associated with shallow trench isolation. In view of the increasing demand for multiple function integration, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a semiconductor substrate having an active region, implanted with impurities of a first type at a first concentration; forming an isolation region around the active region; forming a parasitic transistor by applying a gate electrode, implanted with impurities of a second type at a second concentration, over the active region and the isolation region; and applying an isolation edge implant, with the impurities of the first type at a third concentration greater than or equal to the second concentration, for suppressing the parasitic transistor.

The present invention provides an integrated circuit system including: a semiconductor substrate having an active region, implanted with impurities of a first type at a first concentration; an isolation region around the active region; a parasitic transistor formed by a gate electrode, implanted with impurities of a second type at a second concentration, over the active region and the isolation region; and an isolation edge implant, with the impurities of the first type at a third concentration that is greater than or equal to the second concentration, for suppressing the parasitic transistor.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
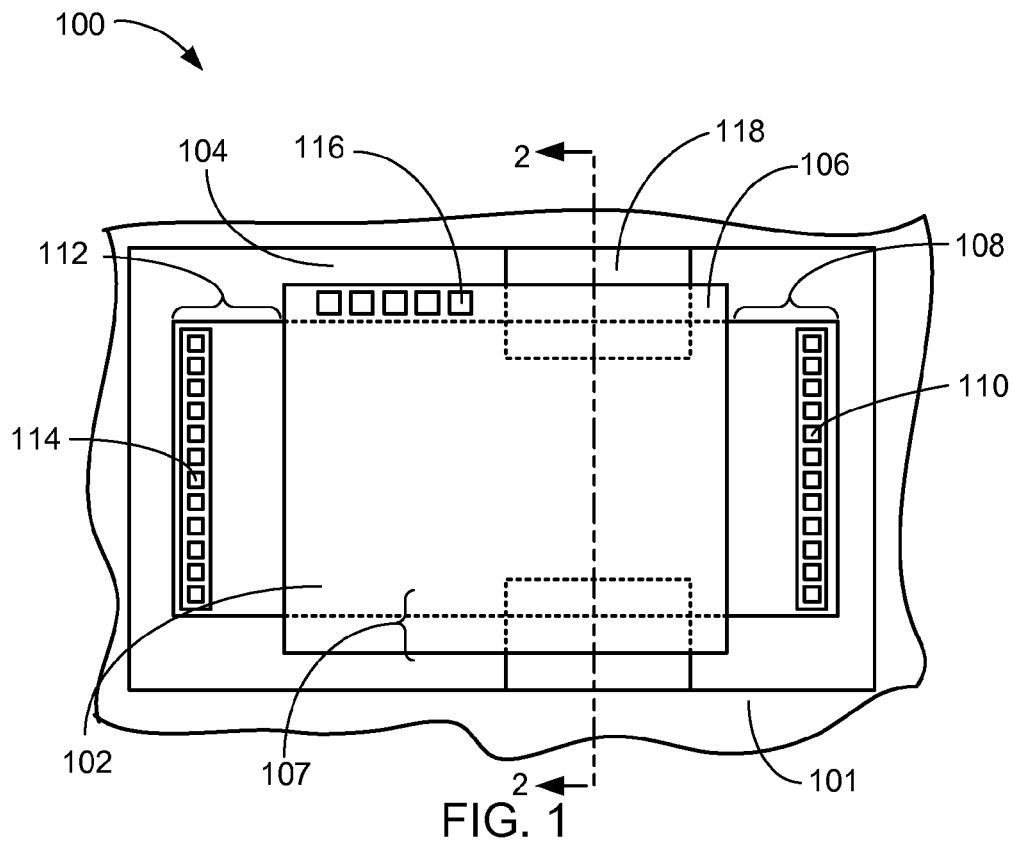
FIG. 1 is a top plan view of an integrated circuit system with high voltage transistor in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

The double hump issue is more pronounced for high-voltage devices due to lower well concentration and higher operating voltage. The primary description is focused on a high voltage (HV) NMOS device, as an example only, because the NMOS device displays a more pronounced double hump issue than a PMOS device. It is understood that the present invention is not limited to high voltage devices or to a particular well implant, but instead may address any device that borders a shallow trench isolation region.

Referring now to FIG. 1, therein is shown a top plan view of an integrated circuit system 100 with high voltage transistor in an embodiment of the present invention. The top plan view of the integrated circuit system 100 depicts a semiconductor substrate 101 having an active region 102, such as an area lightly doped with impurities of a first type at a first concentration.

For this example p-type impurities are implanted in the active region, though it is understood that n-type impurities may be used for another implementation of the current invention. It is also understood that the first concentration may be a very low concentration of the implanted impurities.

An isolation region 104, such as a shallow trench isolation (STI) region, borders the active region 102 to isolate it from the rest of the semiconductor substrate 101. A gate electrode 106, such as a poly-silicon layer, may be patterned over the isolation region 104 and intersecting the active region 102. A parasitic transistor 107 may be formed by the gate electrode 106 positioned over the boundary of the active region 102 and the isolation region 104.

A source 108 may be formed by the active region 102 that may extend beyond the isolation region 104 and the gate electrode 106. The source 108 may further be formed by an implantation of impurities of a second type in a second concentration, where the second type is opposite the first type and the second concentration is greater than the first. A source contact 110 may be formed in the source 108 for connection to other devices on the semiconductor substrate 101.

A drain 112 may be formed by the active region 102 that may extend beyond the isolation region 104 and the gate electrode 106. The drain 112 may further be formed by an implantation of impurities of the second type in the second concentration. A drain contact 114 may be formed in the source 108 for connection to other devices on the semiconductor substrate 101.

A gate contact 116 may be formed on the gate electrode 106 in an area outside the active region 102. The gate electrode 106 may be implanted with impurities of the second type at the first concentration or greater.

In the CMOS-compatible high voltage (HV) process, different operating voltage devices are integrated into the semiconductor substrate 101. In some applications, dual-gate or tripe-gate processes may be used. In general, these processes include low voltage (LV) core devices, medium voltage (MV) I/O devices, and HV devices. Each of these device types use a different well and source/drain implants, such as lightly doped drain (LDD) implantation. In order to achieve better device performance and more robust reliability, HV and MV drift implants are performed before the gate electrode 106 formation.

An isolation edge implant 118, such as an implantation of the first type in a third concentration where the third concentration is equal to or greater than the second concentration, may be formed overlapping the active region 102 and the isolation region 104 boundary. The isolation edge implant 118 is formed prior to the formation of the gate electrode 106.

It has been discovered that the double hump issue, which may be caused by activation of the parasitic transistors 107, may be eliminated by applying the isolation edge implant 118, having a concentration greater than that of the active region and a minimum overlap of the active region of 0.1 μm. It has further been discovered that several of the existing process implants already available in the high voltage compatible CMOS process having a concentration in the range of $5.0 \times 10^{11}$ to $1.0 \times 10^{16}$ atoms per $cm^2$ may be used with equal success, thus solving the double hump issue without adding masks or process steps. This discovery eliminates a problem that has vexed integrated circuit designers for many years and been the source of field reliability issues that costs millions of dollars in material and productivity.

It has been discovered that the isolation edge implant 118 may include implants from the following: LVPWELL, which includes impurities of the first type at a concentration far greater than the first concentration; high voltage p-type double diffused drain (HVPDDD), which includes impurities of the first type at a concentration far greater than the first concentration; medium voltage p-type lightly doped drain (MVPLDD), which includes impurities of the first type at a concentration greater than or equal to the second concentration.

It is understood that the above list of implants was chosen to address the double hump issue in the HV NMOS device of the current example and that a different set of masks would be available for a high voltage PMOS (HV PMOS) device. It is further understood that the isolation edge implant 118 may also be applied for any medium voltage or low voltage devices that may border the isolation region 104.

It has been discovered that the inclusion of the isolation edge implant 118 may significantly increase the threshold voltage (Vth) of the parasitic transistors 107, effectively preventing them from ever becoming activated. It has been further discovered that the isolation edge implant 118 may disrupt the electric field that is formed along the STI edge, thus rendering unnecessary the additional process steps needed to perform rounding of the trench edge.

Figure 2:
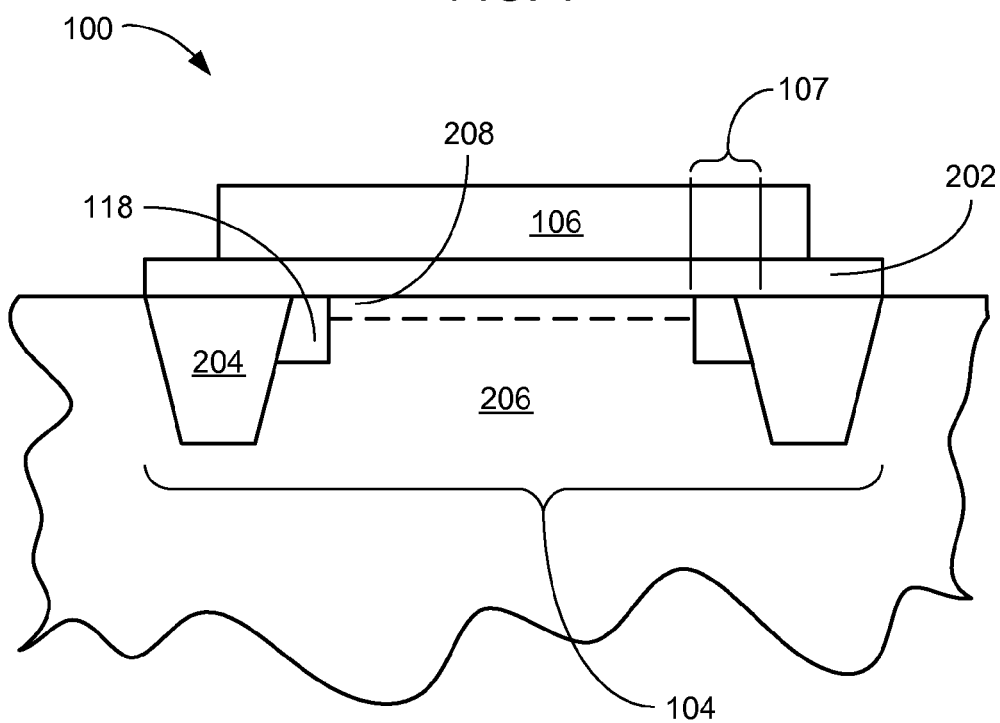
FIG. 2 is a cross-sectional view of the integrated circuit system of FIG. 1 as viewed along the line 2-2, of FIG. 1.

Referring now to FIG. 2, therein is shown a cross-sectional view of the integrated circuit system 100, of FIG. 1, as viewed along the line 2-2, of FIG. 1. The cross-sectional view of the integrated circuit system 100 depicts the gate electrode 106 formed over a gate oxide layer 202.

The gate oxide layer 202 may extend beyond the gate electrode 106 and over the isolation region 104. The isolation region 104 may extend to the outer edge of trenches 204. The isolation edge implant 118 may be formed overlapping the inner edge of the trenches 204. A well region 206 may be implanted with the first impurity at the first concentration for forming a channel 208 when the device is activated.

While the isolation edge implant 118 is shown extending beyond the isolation region 104, this is for example only and the isolation edge implant 118 is only required to traverse the inner edge of the trenches 204 in order to be effective.

Figure 3:
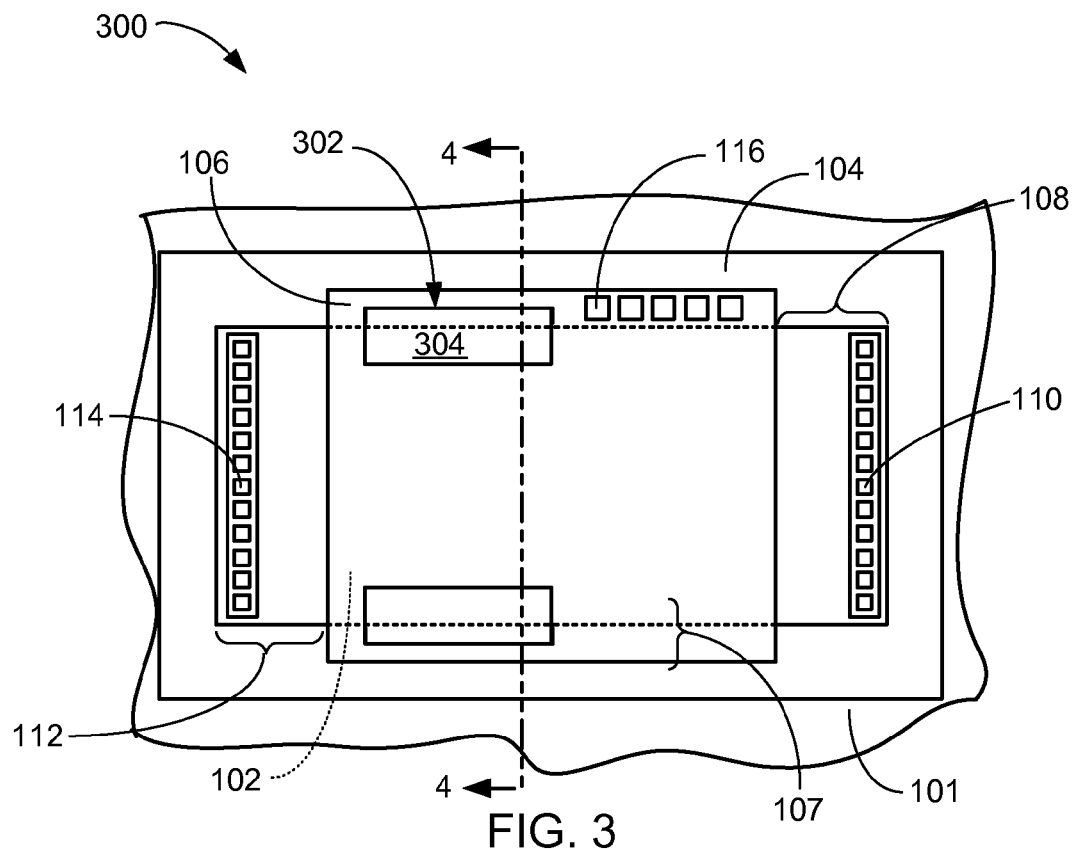
FIG. 3 is a top plan view of an integrated circuit system with high voltage transistor in a first alternative embodiment of the present invention.

Referring now to FIG. 3, therein is shown a top plan view of an integrated circuit system 300 with high voltage transistor in a first alternative embodiment of the present invention.

The top plan view of the integrated circuit system 300 depicts the semiconductor substrate 101 having the active region 102, such as the area lightly doped with impurities of the first type at the first concentration.

For this example p-type impurities are implanted in the active region, though it is understood that n-type impurities may be used for another implementation of the current invention. It is also understood that the first concentration may be a very low concentration of the implanted impurities.

The isolation region 104, such as the shallow trench isolation (STI) region, borders the active region 102 to isolate it from the rest of the semiconductor substrate 101. The gate electrode 106, such as a poly-silicon layer, may be patterned over the isolation region 104 and intersecting the active region 102. The parasitic transistor 107 may be formed by the gate electrode 106 positioned over the boundary of the active region 102 and the isolation region 104.

The source 108 may be formed by the active region 102 that may extend beyond the isolation region 104 and the gate electrode 106. The source 108 may further be formed by an implantation of impurities of the second type in the second concentration, where the second type is opposite the first type and the second concentration is greater than the first. The source contact 110 may be formed in the source 108 for connection to other devices on the semiconductor substrate 101.

The drain 112 may be formed by the active region 102 that may extend beyond the isolation region 104 and the gate electrode 106. The drain 112 may further be formed by an implantation of impurities of the second type in the second concentration. The drain contact 114 may be formed in the source 108 for connection to other devices on the semiconductor substrate 101.

The gate contact 116 may be formed on the gate electrode 106 in an area outside the active region 102. The gate electrode 106 may be implanted with impurities of the second type at the first concentration or greater.

During an etch process of the gate electrode 106, an opening 302 may be formed in the gate electrode 106. The opening 302 may be aligned with the inner edge of the trenches 204, of FIG. 2 and extend into the active region 102.

The opening 302 is shown in a very large scale, but this is for example only and the actual opening size may only be limited by the minimum feature size of the technology. A typical opening may be as small as 0.3 μm by 0.3 μm.

An isolation edge implant 304 may be formed through the opening 302. The window implant may be applied using the HVPLDD, after the gate electrode 106 etching process, the P+ implant, after the spacer formation process step, or a combination thereof. The opening 302 may be masked during an N+ implant process of the gate electrode 106, preventing the implant from entering the opening 302.

It is understood that the above implants were chosen to address the double hump issue in the HV NMOS device of the current example and that a different set of masks would be available for a high voltage PMOS (HV PMOS) device. It is further understood that the isolation edge implant 304 may also be applied for any medium voltage or low voltage devices that may border the isolation region 104.

Figure 4:
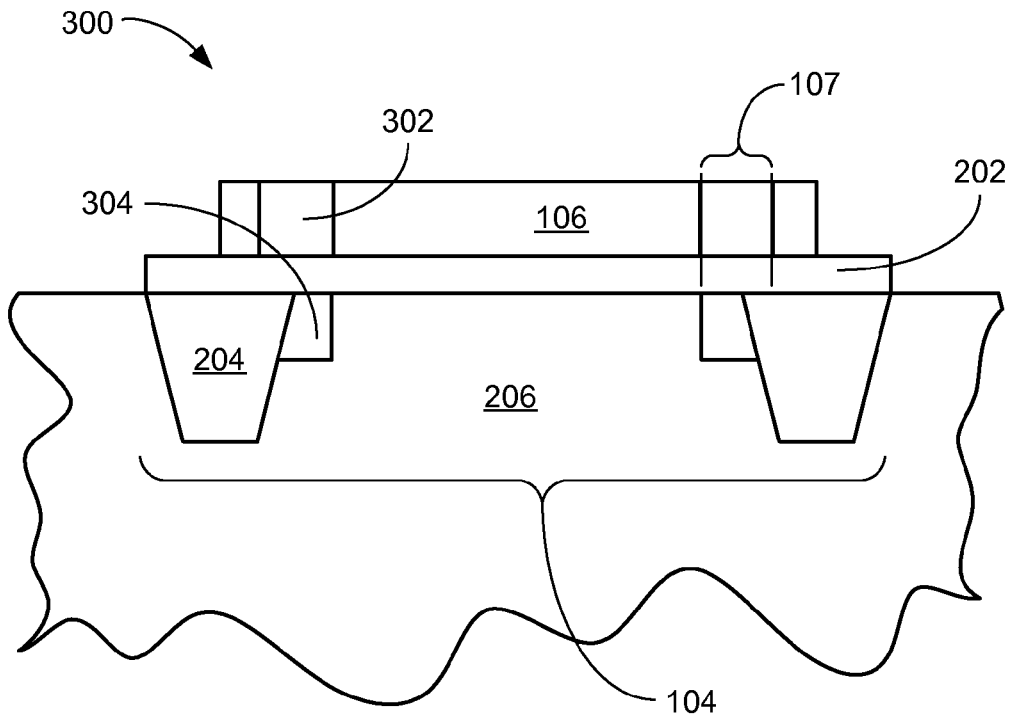
FIG. 4 is a cross-sectional view of the integrated circuit system of FIG. 3 as viewed along the line 4-4, of FIG. 3.

Referring now to FIG. 4, therein is shown a cross-sectional view of the integrated circuit system 300, of FIG. 3 as viewed along the line 4-4, of FIG. 3. The cross-sectional view of the integrated circuit system 300 depicts the gate electrode 106 formed over the gate oxide layer 202.

The gate oxide layer 202 may extend beyond the gate electrode 106 and over the isolation region 104. The gate oxide layer 202 may have the opening 302 positioned near the edge and positioned over the inner edge of the trenches 204.

The isolation region 104 may extend to the outer edge of the trenches 204. The isolation edge implant 304 may be formed overlapping the inner edge of the trenches 204. The well region 206 may be implanted with the first impurity at the first concentration for forming the channel 208 when the device is activated.

It has been discovered that the inclusion of the isolation edge implant 304 may significantly increase the threshold voltage (Vth) of the parasitic transistors 107, effectively preventing them from ever becoming activated. It has been further discovered that the isolation edge implant 304 may disrupt the electric field that is formed along the STI edge, thus rendering unnecessary the additional process steps needed to perform rounding of the trench edge.

Figure 5:
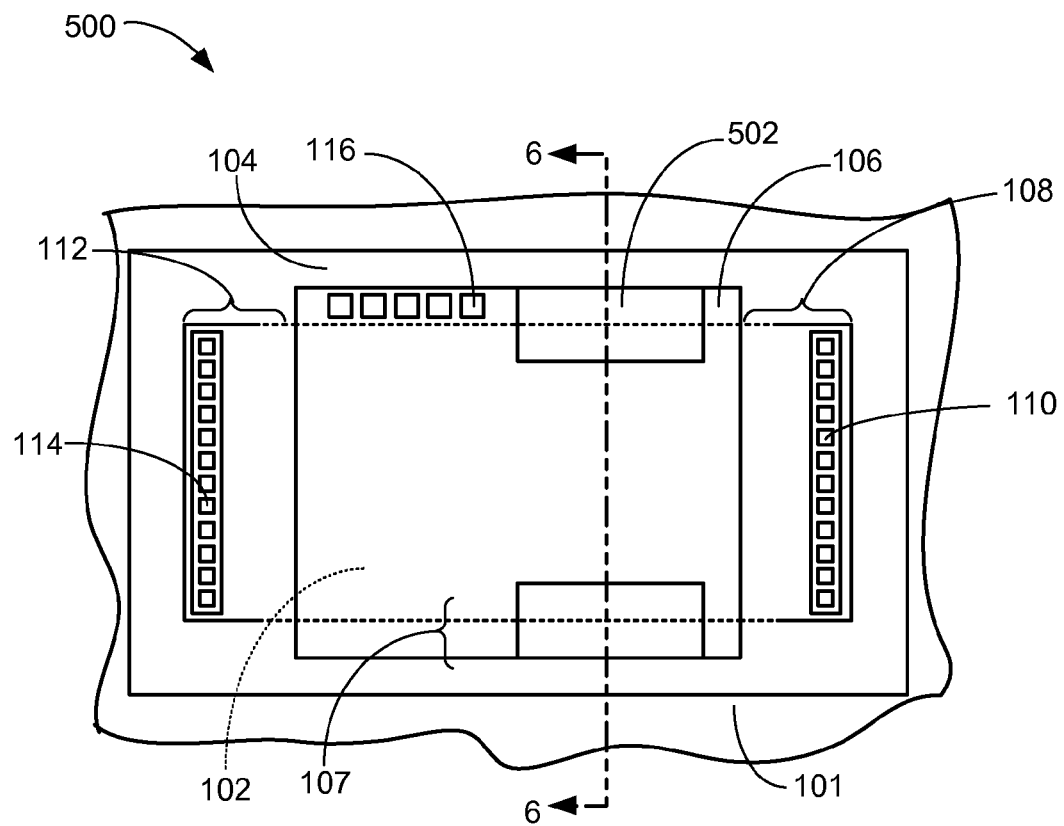
FIG. 5 is a top plan view of an integrated circuit system with high voltage transistor in a second alternative embodiment of the present invention.

Referring now to FIG. 5, therein is shown a top plan view of an integrated circuit system 500 with high voltage transistor in a second alternative embodiment of the present invention. The top plan view of the integrated circuit system 500 depicts the semiconductor substrate 101 having the active region 102, such as the area lightly doped with impurities of the first type at the first concentration.

For this example p-type impurities are implanted in the active region, though it is understood that n-type impurities may be used for another implementation of the current invention. It is also understood that the first concentration may be a very low concentration of the implanted impurities.

The isolation region 104, such as the shallow trench isolation (STI) region, borders the active region 102 to isolate it from the rest of the semiconductor substrate 101. The gate electrode 106, such as a poly-silicon layer, may be patterned over the isolation region 104 and intersecting the active region 102. The parasitic transistor 107 may be formed by the gate electrode 106 positioned over the boundary of the active region 102 and the isolation region 104.

The source 108 may be formed by the active region 102 that may extend beyond the isolation region 104 and the gate electrode 106. The source 108 may further be formed by an implantation of impurities of the second type in the second concentration, where the second type is opposite the first type and the second concentration is greater than the first. The source contact 110 may be formed in the source 108 for connection to other devices on the semiconductor substrate 101.

The drain 112 may be formed by the active region 102 that may extend beyond the isolation region 104 and the gate electrode 106. The drain 112 may further be formed by an implantation of impurities of the second type in the second concentration. The drain contact 114 may be formed in the source 108 for connection to other devices on the semiconductor substrate 101.

The gate contact 116 may be formed on the gate electrode 106 in an area outside the active region 102. The gate electrode 106 may be implanted with impurities of the second type at the first concentration or greater.

An N+ implant of the gate electrode 106 may be blocked from an isolation edge implant 502. In a subsequent process step the isolation edge implant 502 may be implanted with a P+ implant. The P+ implant injects impurities of the first type in a concentration much greater than the first concentration.

It has been discovered that the inclusion of the P+implant in the isolation edge implant 502 may significantly increase the threshold voltage (Vth) of the parasitic transistors 107, effectively preventing them from ever becoming activated. It has been further discovered that the isolation edge implant 502 may disrupt the electric field that is formed along the STI edge, thus rendering unnecessary the additional process steps needed to perform rounding of the trench edge.

Figure 6:
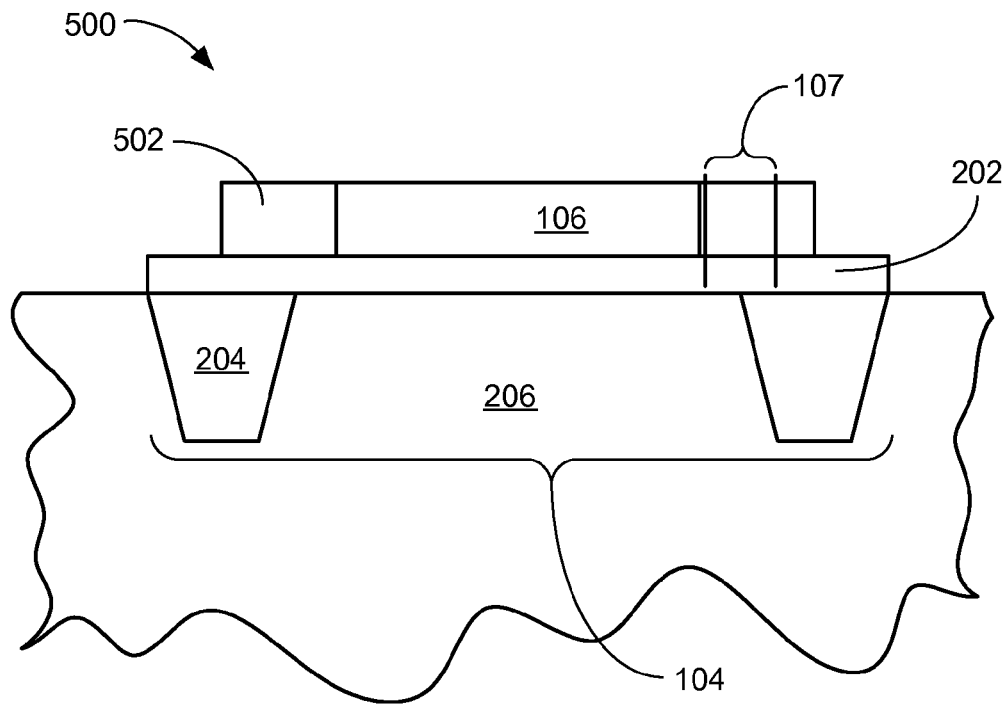
FIG. 6 is a cross-sectional view of the integrated circuit system of FIG. 5 as viewed along the line 2-2, of FIG. 5.

Referring now to FIG. 6, therein is shown a cross-sectional view of the integrated circuit system 500, of FIG. 5 as viewed along the line 2-2, of FIG. 5. The cross-sectional view of the integrated circuit system 500 depicts the gate electrode 106 formed over the gate oxide layer 202.

The gate oxide layer 202 may extend beyond the gate electrode 106 and over the isolation region 104. The gate oxide layer 202 may have the isolation edge implant 502 positioned near the edge and positioned over the inner edge of the trenches 204 and the gate electrode 106 may be implanted with the P+ implant in that area.

The isolation region 104 may extend to the outer edge of the trenches 204. The isolation edge implant 502 may be formed overlapping the inner edge of the trenches 204. The well region 206 may be implanted with the first impurity at the first concentration for forming the channel 208 when the device is activated.

It has been discovered that the inclusion of the isolation edge implant 502 having the P+ implant may significantly increase the threshold voltage (Vth) of the parasitic transistors 107, effectively preventing them from ever becoming activated. It has been further discovered that the isolation edge implant 304 may disrupt the electric field that is formed along the STI edge, thus rendering unnecessary the additional process steps needed to perform rounding of the trench edge.

Figure 7:
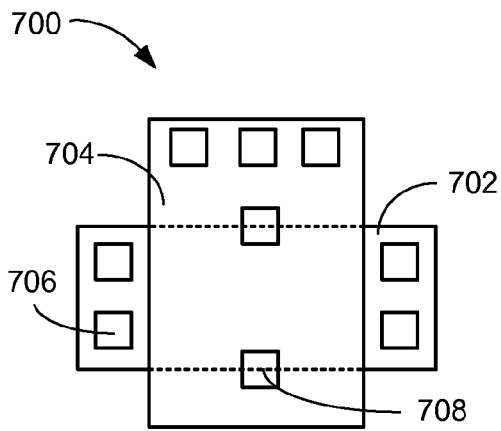
FIG. 7 is a top plan view of an integrated circuit system with high voltage transistor having a first implant shape.

Referring now to FIG. 7, therein is shown a top plan view of an integrated circuit system 700 with high voltage transistor having a first implant shape. The top plan view of the integrated circuit system 700 depicts an active region 702 bordered by an isolation region (not shown). A gate electrode 704, such as a poly-silicon layer, may traverse the active region 702.

A first implant shape 708, such as a square, may be positioned at the boundary between the active region 702 and the isolation region (not shown). The first implant shape 708 may be positioned anywhere along the edge of the active region 702 as long as it falls within the gate electrode 704.

A contact 706 may be used to interconnect the integrated circuit system 700 with other devices. It is understood that the geometry described resides on the semiconductor substrate 101, of FIG. 1.

Figure 8:
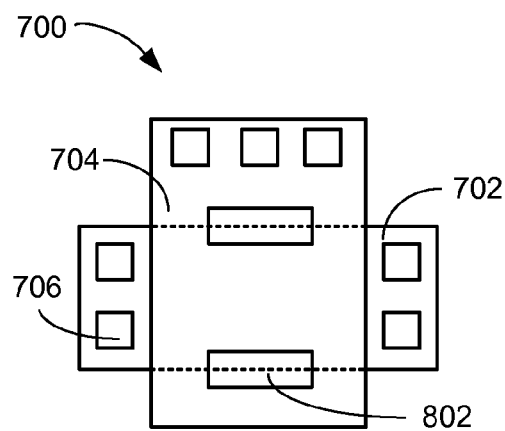
FIG. 8 is a top plan view of an integrated circuit system with high voltage transistor having a second implant shape.

Referring now to FIG. 8, therein is shown a top plan view of the integrated circuit system 700 with high voltage transistor having a second implant shape 802. The top plan view of the integrated circuit system 700 depicts the active region 702 bordered by an isolation region (not shown). The gate electrode 704, such as a poly-silicon layer, may traverse the active region 702.

The second implant shape 802, such as a rectangle having a longer dimension along the active region 702, may be positioned at the boundary between the active region 702 and the isolation region (not shown). The second implant shape 802 may be positioned anywhere along the edge of the active region 702 as long as it falls within the gate electrode 704.

The contact 706 may be used to interconnect the integrated circuit system 700 with other devices. It is understood that the geometry described resides on the semiconductor substrate 101, of FIG. 1.

Figure 9:
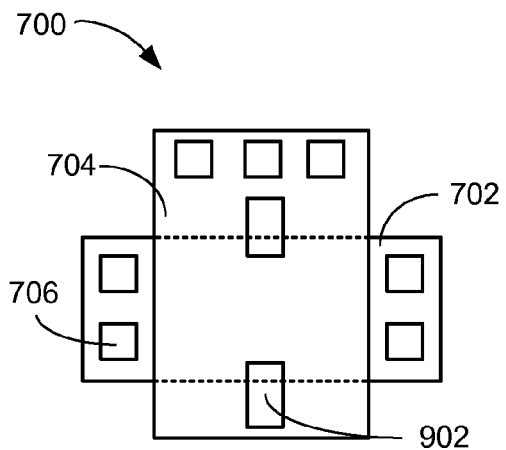
FIG. 9 is a top plan view of an integrated circuit system with high voltage transistor having a third implant shape.

Referring now to FIG. 9, therein is shown a top plan view of the integrated circuit system 700 with high voltage transistor having a third implant shape 902. The top plan view of the integrated circuit system 700 depicts the active region 702 bordered by an isolation region (not shown). The gate electrode 704, such as a poly-silicon layer, may traverse the active region 702.

The third implant shape 902, such as a rectangle having a shorter dimension along the active region 702, may be positioned at the boundary between the active region 702 and the isolation region (not shown). The third implant shape 902 may be positioned anywhere along the edge of the active region 702 as long as it falls within the gate electrode 704.

The contact 706 may be used to interconnect the integrated circuit system 700 with other devices. It is understood that the geometry described resides on the semiconductor substrate 101, of FIG. 1.

Figure 10:
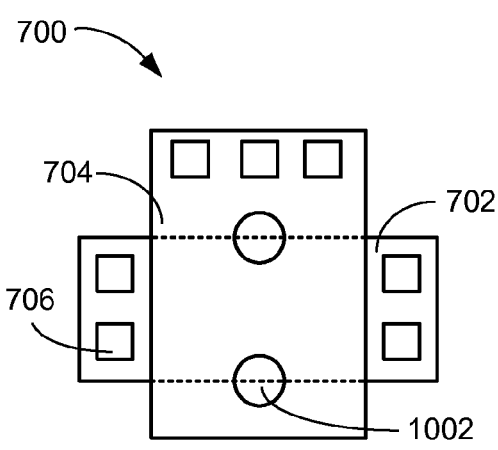
FIG. 10 is a top plan view of an integrated circuit system with high voltage transistor having a fourth implant shape.

Referring now to FIG. 10, therein is shown a top plan view of the integrated circuit system 700 with high voltage transistor having a fourth implant shape 1002. The top plan view of the integrated circuit system 700 depicts the active region 702 bordered by an isolation region (not shown). The gate electrode 704, such as a poly-silicon layer, may traverse the active region 702.

The fourth implant shape 1002, such as a circle, may be positioned at the boundary between the active region 702 and the isolation region (not shown). The fourth implant shape 1002 may be positioned anywhere along the edge of the active region 702 as long as it falls within the gate electrode 704.

The contact 706 may be used to interconnect the integrated circuit system 700 with other devices. It is understood that the geometry described resides on the semiconductor substrate 101, of FIG. 1.

Figure 11:
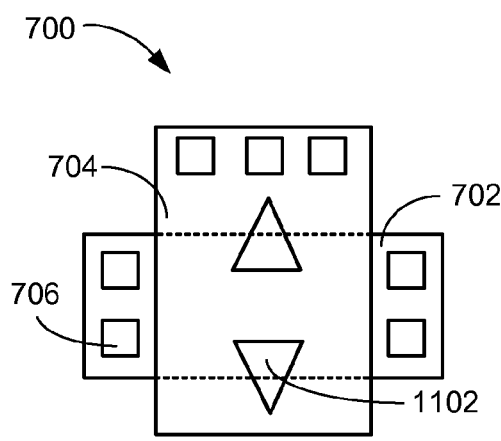
FIG. 11 is a top plan view of an integrated circuit system with high voltage transistor having a fifth implant shape.

Referring now to FIG. 11, therein is shown a top plan view of the integrated circuit system 700 with high voltage transistor having a fifth implant shape 1102. The top plan view of the integrated circuit system 700 depicts the active region 702 bordered by an isolation region (not shown). The gate electrode 704, such as a poly-silicon layer, may traverse the active region 702.

The fifth implant shape 1102, such as a triangle having a base of the triangle on the active region 702, may be positioned at the boundary between the active region 702 and the isolation region (not shown). The fifth implant shape 1102 may be positioned anywhere along the edge of the active region 702 as long as it falls within the gate electrode 704.

The contact 706 may be used to interconnect the integrated circuit system 700 with other devices. It is understood that the geometry described resides on the semiconductor substrate 101, of FIG. 1.

Figure 12:
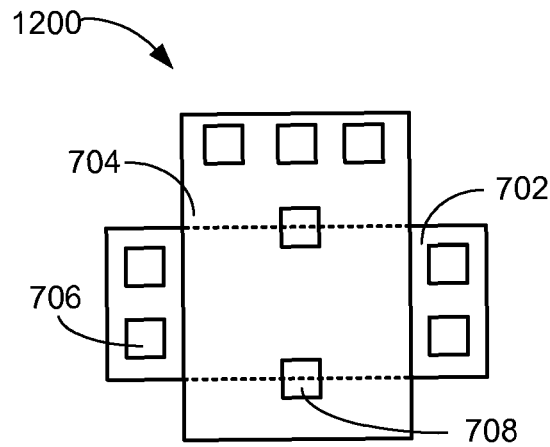
FIG. 12 is a top plan view of an integrated circuit system with high voltage transistor having a first implant location.

Referring now to FIG. 12, therein is shown a top plan view of an integrated circuit system 1200 with high voltage transistor having the first implant shape 708. The top plan view of the integrated circuit system 1200 depicts the active region 702 bordered by an isolation region (not shown). The gate electrode 704, such as a poly-silicon layer, may traverse the active region 702.

The first implant shape 708, such as a square, may be positioned at the boundary between the active region 702 and the isolation region (not shown). The first implant shape 708 may be positioned along the edge of the active region 702 and within the gate electrode 704. The first implant shape 708 may be in a centralized position relative to the gate electrode 704.

The contact 706 may be used to interconnect the integrated circuit system 1200 with other devices. It is understood that the geometry described resides on the semiconductor substrate 101, of FIG. 1.

Figure 13:
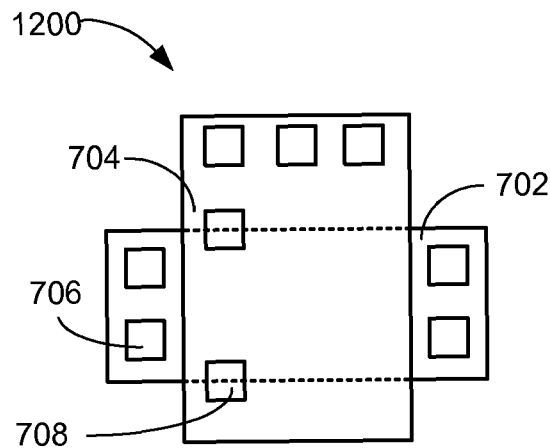
FIG. 13 is a top plan view of an integrated circuit system with high voltage transistor having a second implant location.

Referring now to FIG. 13, therein is shown a top plan view of the integrated circuit system 1200 with high voltage transistor having the first implant shape 708. The top plan view of the integrated circuit system 1200 depicts the active region 702 bordered by an isolation region (not shown). The gate electrode 704, such as a poly-silicon layer, may traverse the active region 702.

The first implant shape 708, such as a square, may be positioned at the boundary between the active region 702 and the isolation region (not shown). The first implant shape 708 may be positioned along the edge of the active region 702 and within the gate electrode 704. The first implant shape 708 may be in a shifted left position relative to the gate electrode 704.

The contact 706 may be used to interconnect the integrated circuit system 1200 with other devices. It is understood that the geometry described resides on the semiconductor substrate 101, of FIG. 1.

Figure 14:
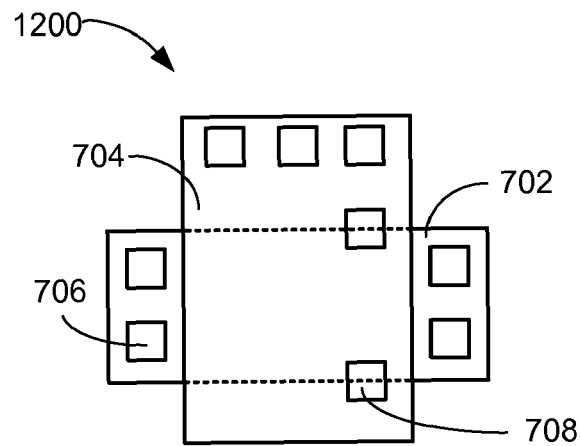
FIG. 14 is a top plan view of an integrated circuit system with high voltage transistor having a third implant location.

Referring now to FIG. 14, therein is shown a top plan view of the integrated circuit system 1200 with high voltage transistor having the first implant shape 708. The top plan view of the integrated circuit system 1200 depicts the active region 702 bordered by an isolation region (not shown). The gate electrode 704, such as a poly-silicon layer, may traverse the active region 702.

The first implant shape 708, such as a square, may be positioned at the boundary between the active region 702 and the isolation region (not shown). The first implant shape 708 may be positioned along the edge of the active region 702 and within the gate electrode 704. The first implant shape 708 may be in a shifted right position relative to the gate electrode 704.

The contact 706 may be used to interconnect the integrated circuit system 1200 with other devices. It is understood that the geometry described resides on the semiconductor substrate 101, of FIG. 1.

It has been discovered that the integrated circuit system 100, of FIG. 1, of the present invention may provide a solution of the double hump issue by applying an implant, of the first type and a concentration much greater than the first concentration, having a shape of a square, a rectangle, a circle, a triangle, or other geometric shape positioned anywhere along the boundary of the active region 102, of FIG. 1, and the isolation region 104, of FIG. 1, as long as it falls within the gate electrode 106, of FIG. 1. It has further been discovered that any of the aforementioned solutions demonstrates equal success in removing the double hump issue.

Figure 15:
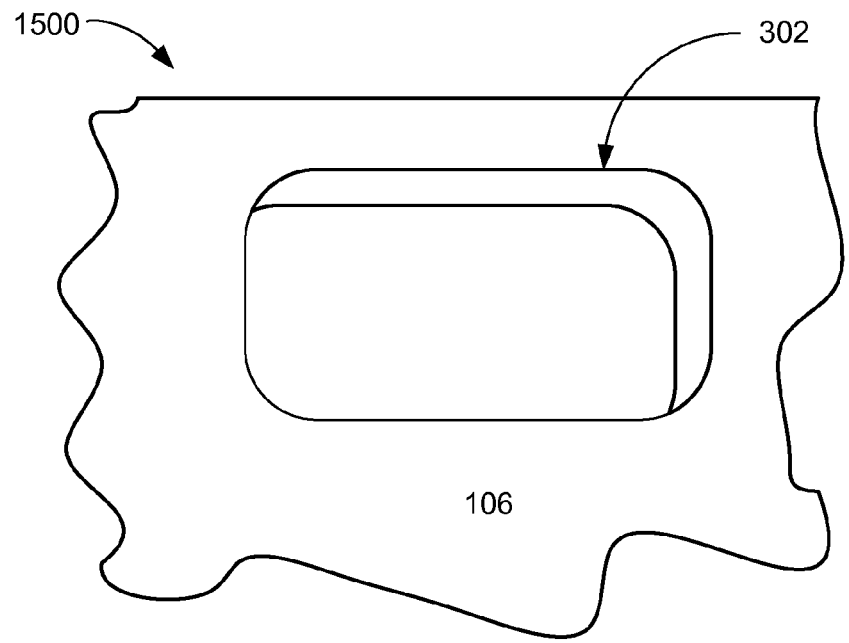
FIG. 15 is an orthogonal view of a poly opening as implemented in an embodiment of the present invention.

Referring now to FIG. 15, therein is shown an orthogonal view of the opening 302 as implemented in an embodiment of the present invention. The orthogonal view of the opening 302 depicts a segment 1500 of the gate electrode 106 having the opening 302. The size and shape of the opening 302 may be maintained through the Poly etch process and the spacer etch process without showing any detectable defects. The ability to maintain an opening on the order of 0.3 μm by 0.3 μm provides good process control and offers process improvement possibilities.

It has been discovered that by implementing the second alternative embodiment, as the integrated circuit system 500, of FIG. 5 a 20% yield improvement was demonstrated. This represents a dramatic improvement without requiring additional masks or process steps. The method and apparatus of the present invention may be applied to double-diffused drain metal oxide semiconductor (DDD MOS), low voltage metal oxide semiconductor (LVMOS), laterally diffused metal oxide semiconductor (LDMOS), vertical double-diffused metal oxide semiconductor (VDMOS), or any other MOS technology utilizing STI.

Figure 16:
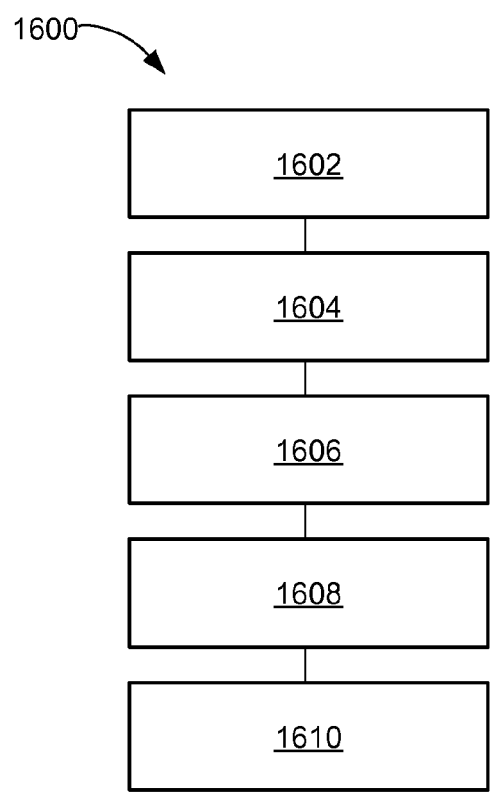
FIG. 16 is a flow chart of a method of manufacture of an integrated circuit system in an embodiment of the present invention.

Referring now to FIG. 16, therein is shown a flow chart of a method 1600 of manufacture of the integrated circuit system 100 in an embodiment of the present invention. The method 1600 includes: providing a semiconductor substrate having an active region, implanted with impurities of a first type at a first concentration in a block 1602; forming an isolation region around the active region in a block 1604; forming an isolation region around the active region in a block 1606;

forming a parasitic transistor by applying a gate electrode, implanted with impurities of a second type at a second concentration, over the active region and the isolation region in a block 1608; and applying an isolation edge implant, with the impurities of the first type at a third concentration greater than or equal to the second concentration, for suppressing the parasitic transistor in a block 1610.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems, utilizing STI, fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    providing a semiconductor substrate having an active region, implanted with impurities of a first type at a first concentration;
    forming an isolation region around the active region;
    forming a parasitic transistor by applying a gate electrode, implanted with impurities of a second type at a second concentration, over the active region and the isolation region; and
    applying an isolation edge implant, with the impurities of the first type at a third concentration that is greater than or equal to the second concentration, for suppressing the parasitic transistor.

2. The method as claimed in claim 1 further comprising forming an opening in the gate electrode for applying the isolation edge implant.

3. The method as claimed in claim 1 further comprising forming a source and a drain on opposite sides of the gate electrode.

4. The method as claimed in claim 1 further comprising forming a channel under the gate electrode.

5. The method as claimed in claim 1 wherein applying the isolation edge implant includes implanting a square, a rectangle, a circle, or a triangle.

6. A method of manufacture of an integrated circuit system comprising:
    providing a semiconductor substrate having an active region, implanted with impurities of a first type at a first concentration;
    forming an isolation region around the active region including forming a shallow trench isolation;
    forming a parasitic transistor by applying a gate electrode, implanted with impurities of a second type at a second concentration, over the active region and the isolation region including applying a layer of poly-silicon on a gate oxide layer; and
    applying an isolation edge implant, with the impurities of the first type at a third concentration that is greater than or equal to the second concentration, for suppressing the parasitic transistor including increasing a threshold voltage of the parasitic transistor.

7. The method as claimed in claim 6 further comprising forming an opening in the gate electrode for applying the isolation edge implant in which forming the opening includes etching the opening to a 0.3 μm by 0.3 μm dimension.

8. The method as claimed in claim 6 further comprising forming a source and a drain on opposite sides of the gate electrode including implanting impurities of a second type at greater than or equal to the first concentration under the source and the drain.

9. The method as claimed in claim 6 further comprising forming a channel under the gate electrode including forming a high voltage metal oxide semiconductor channel, a double-diffused drain metal oxide semiconductor channel, a linear diffused metal oxide semiconductor channel, a vertical double-diffused metal oxide semiconductor channel, a low voltage metal oxide semiconductor channel, or a combination thereof on the semiconductor substrate.

10. The method as claimed in claim 6 wherein applying the isolation edge implant includes implanting a square, a rectangle, a circle, or a triangle including positioning an implant shape within the gate electrode and on the edge of the active region.

11. An integrated circuit system comprising:
    a semiconductor substrate having an active region, implanted with impurities of a first type at a first concentration;
    an isolation region around the active region;
    a parasitic transistor formed by a gate electrode, implanted with impurities of a second type at a second concentration, over the active region and the isolation region; and
    an isolation edge implant, with the impurities of the first type at a third concentration that is greater than or equal to the second concentration, for suppressing the parasitic transistor.

12. The system as claimed in claim 11 wherein the gate electrode having an opening with the isolation edge implant applied therethrough.

13. The system as claimed in claim 11 further comprising a source and a drain on opposite sides of the gate electrode.

14. The system as claimed in claim 11 further comprising a channel under the gate electrode.

15. The system as claimed in claim 11 wherein the isolation edge implant includes a square, a rectangle, a circle, or a triangle implanted.

16. The system as claimed in claim 11 further comprising:
    a shallow trench isolation formed around the active region; and
    a layer of poly-silicon on a gate oxide layer is the gate electrode.

17. The system as claimed in claim 16 wherein the gate electrode having an opening with the isolation edge implant applied therethrough includes a 0.3 μm by 0.3 μm opening in the gate electrode.

18. The system as claimed in claim 16 further comprising a source and a drain on opposite sides of the gate electrode includes impurities of a second type at greater than or equal to the first concentration implanted under the source and the drain.

19. The system as claimed in claim 16 further comprising a channel under the gate electrode includes a high voltage metal oxide semiconductor channel, a double-diffused drain metal oxide semiconductor channel, a linear diffused metal oxide semiconductor channel, a vertical double-diffused metal oxide semiconductor channel, a low voltage metal oxide semiconductor channel, or a combination thereof on the semiconductor substrate.

20. The system as claimed in claim 16 wherein the isolation edge implant includes a square, a rectangle, a circle, or a triangle implanted includes an implant shape within the gate electrode and on the edge of the active region.

* * * * *